(12) United States Patent
Yoshitake et al.

(10) Patent No.: US 9,752,253 B2
(45) Date of Patent: Sep. 5, 2017

(54) EPITAXIAL GROWTH APPARATUS

(71) Applicant: SUMCO CORPORATION, Tokyo (JP)

(72) Inventors: Kan Yoshitake, Tokyo (JP); Kimitaka Okamoto, Tokyo (JP); Haruki Shoji, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 189 days.

(21) Appl. No.: 14/582,566

(22) Filed: Dec. 24, 2014

(65) Prior Publication Data

US 2015/0184313 A1  Jul. 2, 2015

(30) Foreign Application Priority Data

Dec. 27, 2013  (JP) ................................. 2013-271509

(51) Int. Cl.
*C30B 25/10* (2006.01)
*C30B 29/06* (2006.01)
*H01L 21/67* (2006.01)

(52) U.S. Cl.
CPC .............. *C30B 25/10* (2013.01); *C30B 29/06* (2013.01); *H01L 21/67115* (2013.01)

(58) Field of Classification Search
CPC combination set(s) only.
See application file for complete search history.

(56) References Cited

U.S. PATENT DOCUMENTS

| 5,446,825 A * | 8/1995 | Moslehi ............ H01L 21/67115 118/724 |
| 2010/0143579 A1* | 6/2010 | Narahara ............ C23C 16/4583 427/8 |

FOREIGN PATENT DOCUMENTS

| JP | 2000-138170 | 5/2000 |
| JP | 2002-217110 | 8/2002 |
| JP | 2010-147350 | 7/2010 |
| JP | 2011-146537 | 7/2011 |

OTHER PUBLICATIONS

Japan Foreign Official Action received in JP 2013-271509, dated Jul. 4, 2017.

* cited by examiner

*Primary Examiner* — Duy Deo
*Assistant Examiner* — Erin Bergner
(74) *Attorney, Agent, or Firm* — Greenblum & Bernstein, P.L.C.

(57) ABSTRACT

Disclosed herein is an epitaxial growth apparatus for growing an epitaxial layer on a surface of a wafer. The apparatus includes: a chamber in which the wafer is housed; an upper lamp group that includes a plurality of heating lamps arranged in a ring above the chamber; a lower lamp group that includes a plurality of heating lamps provided below the chamber; a reflection member that is provided inside the ring of the upper lamp group, the reflection member having a substantially cylindrical shape; and an additional reflection member that is provided inside the reflection member, the additional reflection member including a reflection surface that is substantially parallel to the surface of the wafer. The additional reflection member is provided in such a way as to close at least part of an opening of a lower end portion of the reflection member.

11 Claims, 7 Drawing Sheets

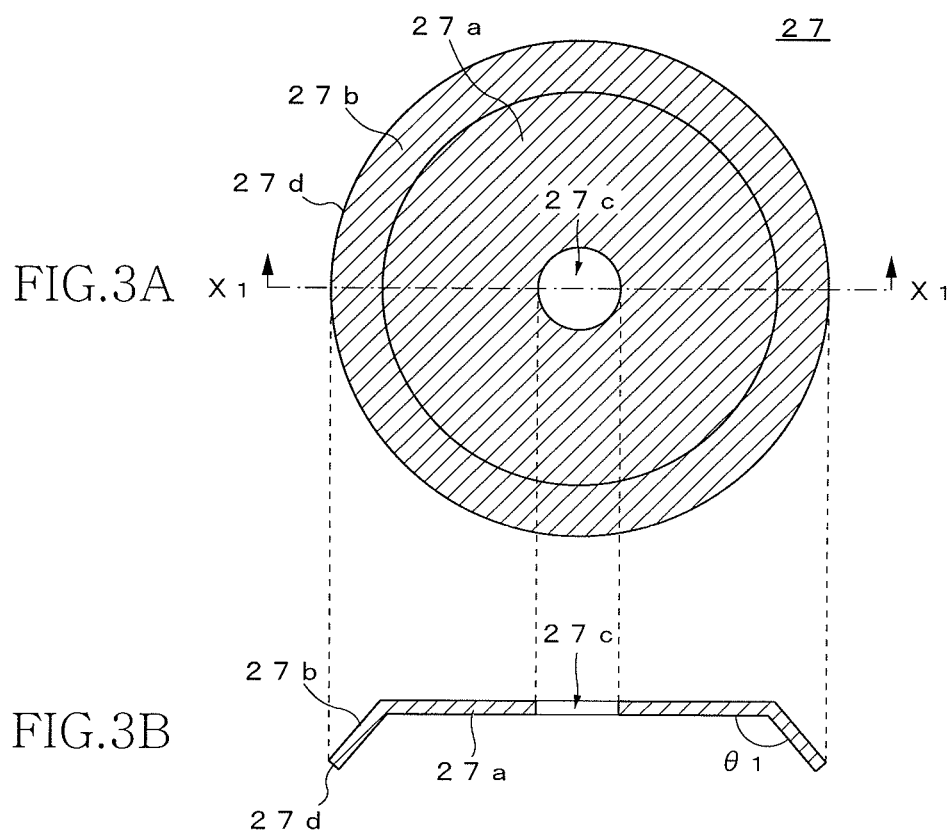

EPITAXIAL GROWTH APPARATUS

BACKGROUND OF THE INVENTION

Field of the Invention

The present invention relates to an epitaxial growth apparatus, and particularly to an epitaxial growth apparatus having a heating structure used to efficiently and evenly heat a wafer in a chamber.

Description of Related Art

An epitaxial growth apparatus is widely used as an apparatus for forming a single crystal layer (epitaxial layer) on the surface of a silicon wafer, for example. In a single wafer-type epitaxial growth apparatus, while a source gas is introduced into a camber in which one wafer is placed horizontally, heating is carried out to achieve a predetermined temperature, thereby growing an epitaxial layer.

The wafer needs to be heated at a high temperature ranging from 1,000 to 1,200 degrees Celsius. Halogen lamps are used as the heating source. Many halogen lamps are arranged in an upper and a lower portion of the chamber. In the upper portion of the chamber, a pyrometer is provided to measure the surface temperature of the wafer. The pyrometer is designed to measure the temperature by receiving thermal radiation energy from an object to be measured. Therefore, an obstacle or an opaque must not exist between the pyrometer and the object to be measured. This is why the halogen lamps are usually arranged in a ring around the pyrometer so as not to be an obstacle between the pyrometer and the wafer.

In order to make the epitaxial layer on the wafer plane as uniform in thickness as possible, the temperature distribution within the wafer plane that is heated by the halogen lamps needs to be as uniform as possible. In the case of Japanese Patent Application Laid-Open No. 2000-138170, a substantially cylindrical reflection member is placed inside the ring of halogen lamps. The reflection member is shaped in such a way that a lower end position of a portion corresponding to each outer heating halogen lamp is lower than a lower end position of a portion corresponding to each inner heating halogen lamp. Infrared rays that are supposed to travel to the inner side of the wafer from each outer heating halogen lamp are reflected by the reflection member before traveling to the outer side of the wafer. Therefore, the amount of infrared rays emitted to a central portion of the wafer is reduced.

Japanese Patent Application Laid-Open No. 2011-146537 discloses an epitaxial production apparatus with a structure in which a lower end portion of a substantially cylindrical reflection wall provided on an outer side of an upper lamp group is tilted to an inner side. In this structure, electromagnetic waves that are radiated in the vertically downward direction from any heating lamp of the upper lamp group are guided to an end portion of the wafer after being reflected by the tilted surface. Therefore, this structure can prevent silicon from adhering to an end portion of the back surface of the wafer, and therefore makes it possible to improve the flatness of the wafer.

However, according to the configuration of the conventional epitaxial growth apparatus, the temperature distribution within the wafer plane heated by the halogen lamps is not sufficiently uniform due to the effects of the reflection member. Therefore, the epitaxial layer may be uneven in thickness. Particularly in the case where the halogen lamps are separated into the outer heating group and the inner heating group as disclosed in Japanese Patent Application Laid-Open No. 2000-138170 and the reflection member is provided in the upper portion of the chamber, the temperatures in the central and outer peripheral regions of the wafer tend to be high, while the intermediate region between the central and outer peripheral regions tends to be low.

If the substantially cylindrical reflection member is provided above the wafer, a flow of air flowing from the upper side to the lower side via the inner portion of the reflection member is generated, and this air flow directly hits a central portion of an upper dome of the chamber that covers the space above the wafer. Therefore, the temperature of the central portion of the upper dome tends to drop, and the problem is that by-products of silicon can easily adhere to the upper dome. If the by-products are attached, the thermal radiation energy from the halogen lamps cannot easily pass through the upper dome. As a result, the temperature in the central region of the wafer is more likely to drop, and the temperature distribution within the wafer plane becomes even more uneven.

SUMMARY

The present invention has been made to solve the above problems. Therefore, the object of the present invention is to provide an epitaxial growth apparatus that can reduce the in-plane unevenness in thickness of an epitaxial layer formed on a main surface of a wafer and which can prevent by-products from adhering to a chamber.

To solve the above problems, an epitaxial growth apparatus of the present invention that grows an epitaxial layer on a surface of a wafer includes: a chamber in which the wafer is housed; an upper lamp group that includes a plurality of heating lamps arranged in a ring above the chamber; a lower lamp group that includes a plurality of heating lamps provided below the chamber; an almost cylindrical reflection member that is provided inside the ring of the upper lamp group and above the chamber; and an additional reflection member that is provided inside the reflection member and above the wafer and which includes a reflection surface that is parallel to the wafer, wherein the additional reflection member is provided in such a way as to close at least part of an opening of a lower end portion of the reflection member.

According to the present invention, electromagnetic waves that are emitted from the upper lamp group and then reflected by an upper surface of the wafer are reflected again by the additional reflection member, and then strike the upper surface of the wafer. Therefore, the in-plane temperature distribution of the upper surface of the wafer becomes uniform, and the uniformity of the in-plane distribution of the thickness of the epitaxial layer can be enhanced. Moreover, an air flow that flows from an upper side to a lower side via an internal space of the reflection member can be blocked. Therefore, it is possible to prevent the deposition of by-products on an upper dome that covers the space above the wafer.

In one embodiment of the present invention, the additional reflection member preferably includes a circular plate portion that constitutes the reflection surface, and a sidewall portion that is provided in such a way as to encircle an outer periphery of the circular plate portion. This configuration can ensure mechanical strength while keeping the reflection surface that is parallel to the wafer as large as possible.

The epitaxial growth apparatus of the present invention preferably further includes a pyrometer that is provided above the chamber and the center of the wafer, wherein the reflection member is provided in such a way as to surround an optical axis of the pyrometer that extends toward the wafer, the additional reflection member includes a through-hole formed at a center of the circular plate portion, and the optical axis of the pyrometer passes through the through-hole. In order to provide a pyrometer above the center of the wafer, a reflection member needs to be provided between the upper lamp group and the pyrometer. The existence of the reflection member likely leads to unevenness of the in-plane temperature distribution of the wafer. However, according to this configuration, even if such a reflection member is provided, the in-plane temperature distribution of the wafer can be uniform.

The epitaxial growth apparatus of the present invention preferably further includes an almost cylindrical shield tube that is provided inside the reflection member in such a way as to encircle the optical axis of the pyrometer, wherein the shield tube is inserted into the through-hole of the additional reflection member. Furthermore, a tapered portion is preferably provided in a lower end portion of the reflection member in such a way that a diameter thereof becomes gradually smaller toward a lower side, and an outer peripheral end of the additional reflection member is in contact with an inner peripheral surface of the tapered portion. According to this configuration, it is possible to determine a planar-direction position of the additional reflection member just by inserting the shield tube into the through-hole. Therefore, the additional reflection member can be easily handled in such cases as when the additional reflection member is placed. Moreover, the additional reflection member can be placed easily and stably only by the additional reflection member's own weight, and the reflection surface automatically becomes parallel to the wafer.

According to the present invention, the additional reflection member is preferably made of the same material as the reflection member. According to this configuration, when the reflection member and the additional reflection member are thermally expanded by a temperature change inside the chamber, the deformation, positional deviation, and other trouble of the additional reflection member can be prevented, because the reflection member and the additional reflection member are equal in thermal expansivity.

According to the present invention, it is possible to provide an epitaxial growth apparatus that can reduce the in-plane unevenness in thickness of an epitaxial layer formed on an upper surface of a wafer and which can prevent by-products from adhering to a chamber.

BRIEF DESCRIPTION OF THE DRAWINGS

The above features and advantages of the present invention will be more apparent from the following description of certain preferred embodiments taken in conjunction with the accompanying drawings, in which:

FIG. 3A is a schematic plan view showing the shape of the additional reflection member;

FIG. 3B is a side cross-sectional view along a X1-X1 line;

DETAILED DESCRIPTION OF THE EMBODIMENTS

Preferred embodiments of the present invention will be explained below in detail with reference to the accompanying drawings.

Figure 1:
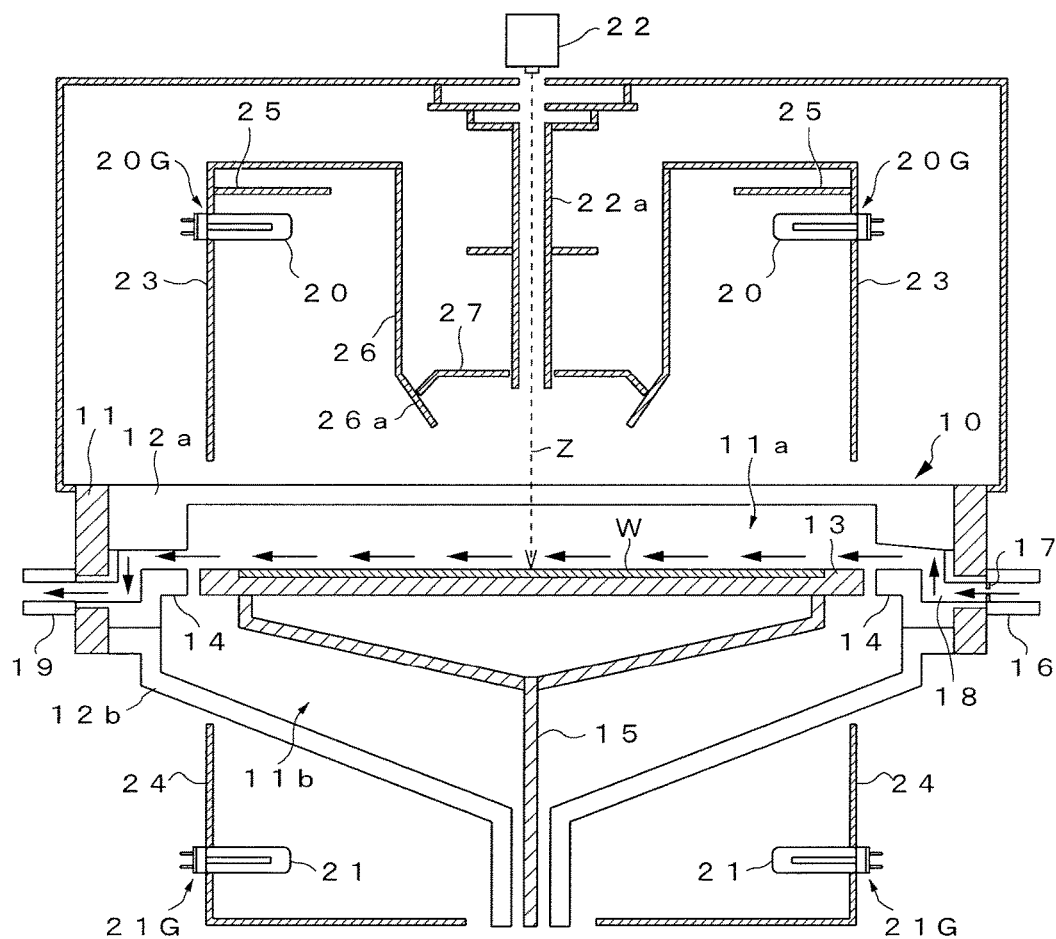
FIG. 1 is a schematic side cross-sectional view showing the configuration of an epitaxial growth apparatus according to a preferred embodiment of the present invention.

FIG. 1 is a schematic side cross-sectional view showing the configuration of an epitaxial growth apparatus 1 according to a preferred embodiment of the present invention.

As shown in FIG. 1, an epitaxial growth apparatus 1 is a single wafer-type apparatus that can process silicon wafers one by one. The epitaxial growth apparatus 1 includes a chamber 10 in which a wafer W is housed, and a susceptor 13 which supports the wafer W horizontally in the chamber 10 from a lower surface side thereof. The susceptor 13 is supported by a support shaft 15 in a rotatable manner. In one side portion of the chamber 10, a gas inlet 16, a baffle 17, and a rectifying member 18 are provided. In the other side portion opposite to the one side portion, a gas outlet 19 is provided. Incidentally, predetermined directions in the epitaxial growth apparatus 1 are defined based on normal usage conditions thereof. Therefore, the term "upward" means a direction from a lower surface of the wafer W placed horizontally in the chamber 10 to an upper surface thereof, and the term "downward" means a direction from the upper surface of the wafer to the lower surface.

The chamber 10 includes an annular base ring 11, an upper dome 12a that covers the space above the wafer W, and a lower dome 12b that covers the space below the wafer W. The internal portion of the chamber 10 that is sandwiched between the upper dome 12a and the lower dome 12b is an enclosed space. The base ring 11 may be made of stainless steel. The upper dome 12a and the lower dome 12b are made mainly of a transparent quartz material that does not block electromagnetic waves emitted from a heating source. According to the present embodiment, what is shown is an example in which the upper dome 12a is a flat plate. Alternatively, the upper dome 12a may be bent into a convex shape toward the outer side (upper side). The lower dome 12b is funnel-shaped. The upper dome 12a and the lower dome 12b are fixed to the base ring 11. The upper dome 12a and the lower dome 12b are detachable with respect to the base ring 11. At the time of maintenance, the upper dome 12a and the lower dome 12b are detached from the base ring 11, and maintenance work, including removal of silicon by-products adhering to the inner surface thereof, is carried out.

Above the chamber 10, an upper lamp group 20G is provided to heat the upper surface of the wafer W. Below the chamber 10, a lower lamp group 21G is provided to heat the lower surface of the wafer W. The upper lamp group 20G and the lower lamp group 21G each include a plurality of horizontal-type halogen lamps 20 that are arranged in a ring in a predetermined order.

Figure 2:
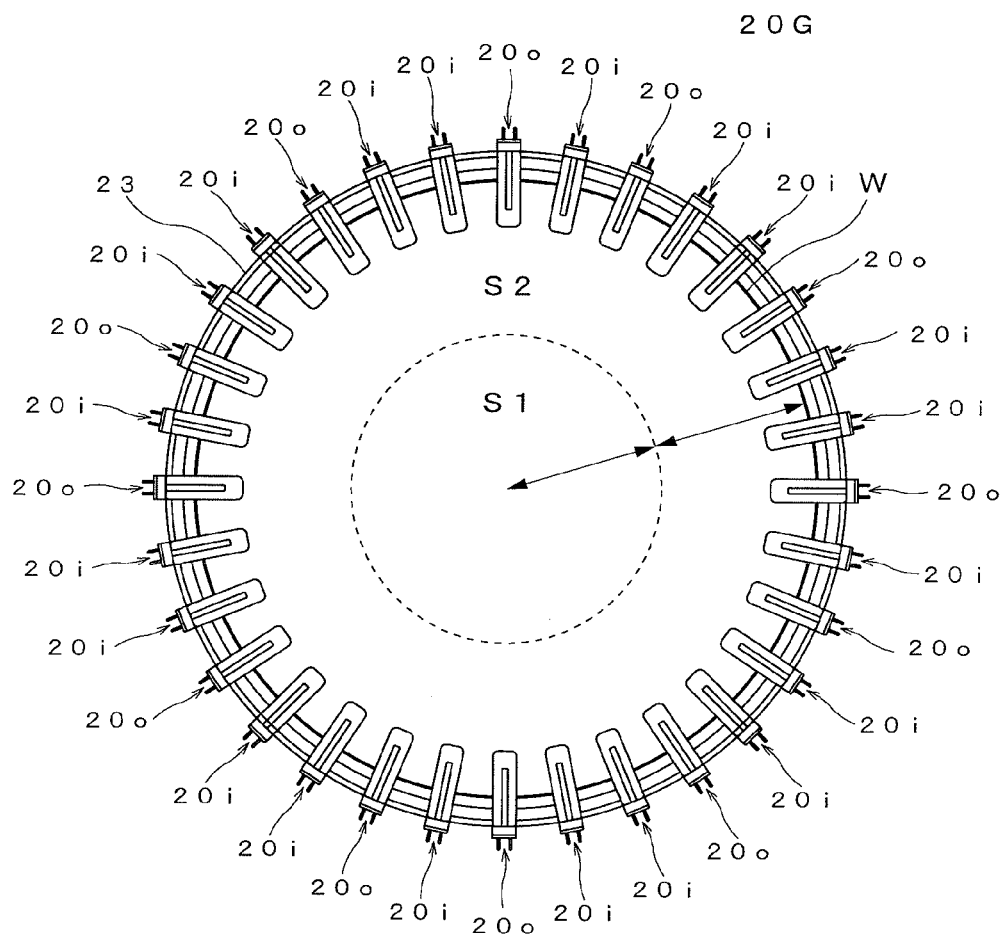
FIG. 2 is a schematic plan view showing a layout of an upper lamp group in the epitaxial growth apparatus shown in FIG. 1.

FIG. 2 is a schematic plan view showing a layout of an upper lamp group 20G in the epitaxial growth apparatus 1 shown in FIG. 1.

As shown in FIG. 2, the upper lamp group 20G includes twenty inner heating halogen lamps 20*i* that are designed to heat mainly an inner region in a radial-direction (central region) S1 of the wafer W, and twelve outer heating halogen lamps 20*o* that are designed to heat mainly an outer region in a radial-direction (outer peripheral region) S2 of the wafer W. The lamps are arranged in a ring in a predetermined order.

As shown in FIG. 1, a reflection wall 23 is placed outside the upper lamp group 20G to confine electromagnetic waves from each halogen lamp 20 within a lamp house. The upper lamp group 20G is encircled by the reflection wall 23. Similarly, outside the lower lamp group 21G, a reflection wall 24 is placed to confine electromagnetic waves from each halogen lamp 21 within a lamp house. The lower lamp group 21G is encircled by the reflection wall 24.

A reflection plate 25 is provided above the upper lamp group 20G. The reflection plate 25 reflects electromagnetic waves that are radiated upward from the halogen lamps 20 so that the electromagnetic waves travel to the wafer W that is placed on the susceptor 13. In particular, the planar shape of a portion of the reflection plate 25 that is located above each inner heating halogen lamp 20*i* is different from that of a portion above each outer heating halogen lamp 20*o*. Therefore, electromagnetic waves that are radiated upward from each inner heating halogen lamp 20*i* are directed at the inner region of the wafer W. If the halogen lamps are placed just uniformly, the outer peripheral region S2 of the wafer W that is right below the halogen lamps 20 is heated more strongly than the central region S1 of the wafer W. In such a case, due to the uneven heating, the in-plane distribution of the thickness of an epitaxial layer formed on the surface of the wafer W becomes uneven, and a slip dislocation is likely to occur. However, if some of the halogen lamps 20 are used for heating the internal region of the wafer W and the angle of the reflection plate 25 above those halogen lamps 20 is adjusted, the thermal radiation energy can be dispersed, and the epitaxial layer therefore becomes uniform in thickness.

Above the chamber 10 and above the center of the wafer W, a pyrometer (non-contact type thermocouple thermometer) 22 is mounted. The pyrometer 22 measures the surface temperature of the wafer W by receiving electromagnetic waves radiated from the wafer W. The temperature inside the chamber 10 (particularly the central position of the wafer W) is monitored by the pyrometer 22. A controller, not shown, uses the results of measurement by the pyrometer 22 to control the output power of each halogen lamp 20.

Right below the pyrometer 22, a cylindrical shield tube 22*a* is provided. The shield tube 22*a* is provided in such a way as to surround an optical axis of the pyrometer 22. The shield tube 22*a* provided helps reduce the impact of the heat radiated from the halogen lamps 20 on the measurement system of the pyrometer 22, thereby improving the accuracy of measurement by the pyrometer 22.

A reflection member 26 is placed above the chamber 10. The reflection member 26 is an almost cylindrical member that is made from a gold-plated aluminum plate. The reflection member 26 includes a straight barrel portion having a cylindrical surface that is substantially perpendicular to a main surface of the wafer W. The reflection member 26 is disposed inside the ring of the upper lamp group 20G, and encircles an outer side of the cylindrical shield tube 22*a*. In a lower end portion of the reflection member 26, a tapered portion 26*a* is provided in such a way that the diameter of the cylinder becomes gradually smaller. In the reflection member 26, the angle of the tapered portion 26*a* is preferably set in such a way that the lower end thereof is directed at the center point of the wafer W.

The reflection member 26 is provided to prevent a drop in the accuracy of measurement by the pyrometer 22 due to the effects of electromagnetic waves from the upper lamp group 20G. The reflection member 26 limits the region that is irradiated with electromagnetic waves from each halogen lamp 20. The electromagnetic waves that travel from a halogen lamp 20 to the far side of the center point of the wafer W are blocked by the reflection member 26. Therefore, a region that is closer to the halogen lamp 20 than the center point of the wafer W is irradiated with the electromagnetic waves, and a region that is located on the far side of the center point is not irradiated with the electromagnetic waves.

Inside the reflection member 26, an additional reflection member 27 is provided. The additional reflection member 27 is a substantially disk-shaped member that is made from a gold-plated aluminum plate. The additional reflection member 27 is provided in the space between the shield tube 22*a* and the reflection member 26. The additional reflection member 27 includes a reflection surface that is parallel to the wafer W. The additional reflection member 27 is so provided as to close an opening of the lower end portion of the cylindrical reflection member 26. The additional reflection member 27 is preferably made of the same material as that of the reflection member 26, or may be made of a different material. If the additional reflection member 27 is made of the same material, both are equal in thermal expansivity. Therefore, even when the reflection member 26 and the additional reflection member 27 are thermally expanded due to a change in the temperature inside the chamber 10, the deformation, positional deviation, and other trouble of the additional reflection member 27 can be prevented.

FIG. 3 is diagrams showing the shape of the additional reflection member 27. FIG. 3A is a plan view, and FIG. 3B is a side cross-sectional view.

As shown in FIG. 3, the additional reflection member 27 includes a circular plate portion 27*a* that constitutes a major reflection surface, and a sidewall portion 27*b* that is provided on the outer periphery of the circular plate portion 27*a*. The circular plate portion 27*a* includes a flat surface that is substantially parallel to the main surface of the wafer W. The circular plate portion 27*a* is provided to further reflect the electromagnetic waves that travel upward after being reflected by the upper surface of the wafer W. The sidewall portion 27*b* is provided to ensure the mechanical strength of the additional reflection member 27. The angle of the sidewall portion 27*b* relative to the circular plate portion 27*a* is not specifically limited. The angle is preferably wider than a right angle. This shape allows the surface of the sidewall portion 27*b* to be used as a reflection surface.

In a central portion of the additional reflection member 27 (or a central portion of the circular plate portion 27*a*), a through-hole 27*c* is provided. The shield tube 22*a* of the pyrometer 22 is provided in such a way as to pass through the through-hole 27*c*. An outer peripheral edge 27*d* (or tip of the sidewall portion 27*b*) of the additional reflection member 27 is in contact with the surface (inner peripheral surface) of the tapered portion 26*a* of the reflection member 26. Therefore, without the use of a special fixing means, the additional reflection member 27 can be placed horizontally by only its own weight. Therefore, it is very easy to attach the additional reflection member 27 to the reflection member 26 or detach the additional reflection member 27 therefrom.

Figure 4A:
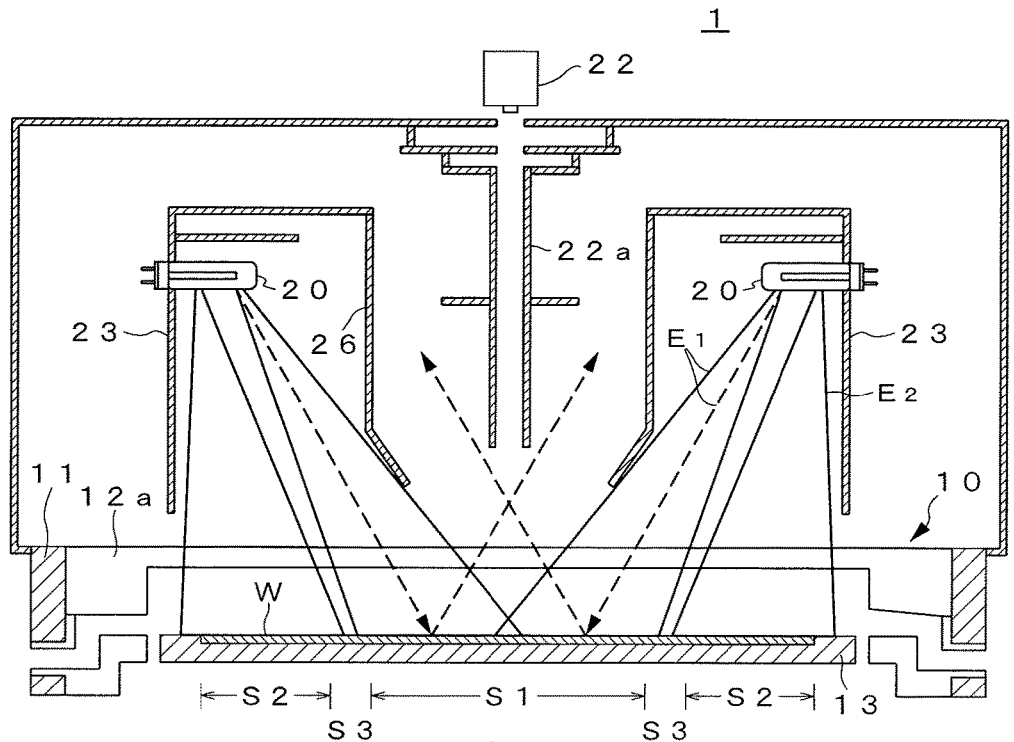
FIG. 4A is schematic diagrams illustrating the functionality of the additional reflection member in the case where the additional reflection member is not provided.
Figure 4B:
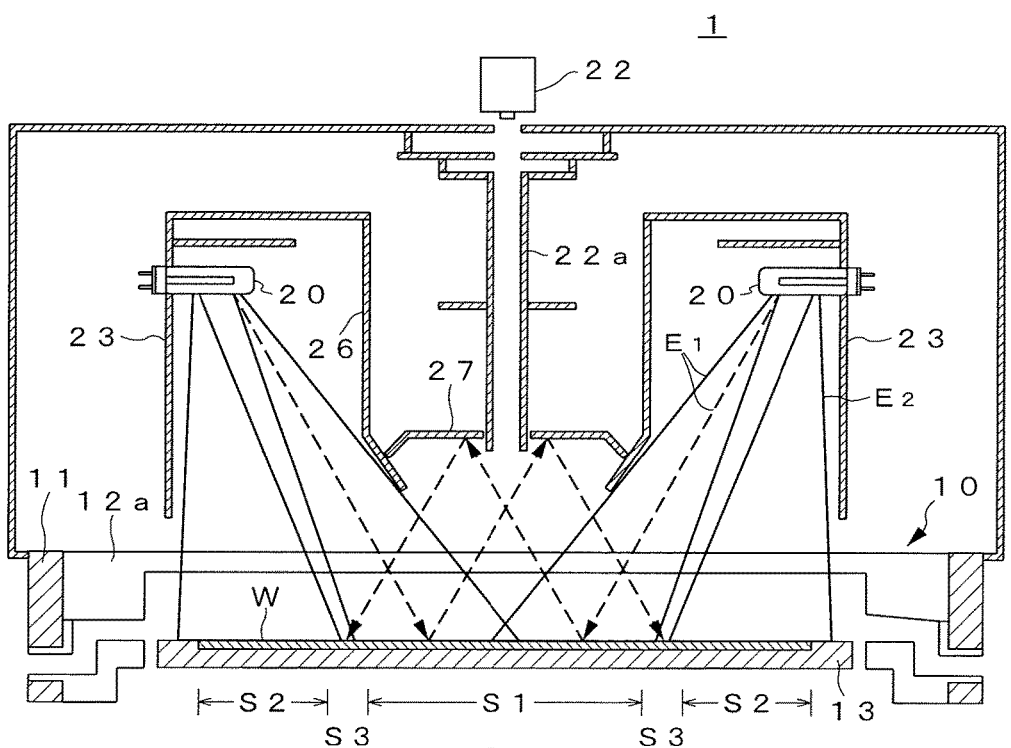
FIG. 4B is schematic diagrams illustrating the functionality of the additional reflection member in the case where the additional reflection member is provided.
Figure 5A:
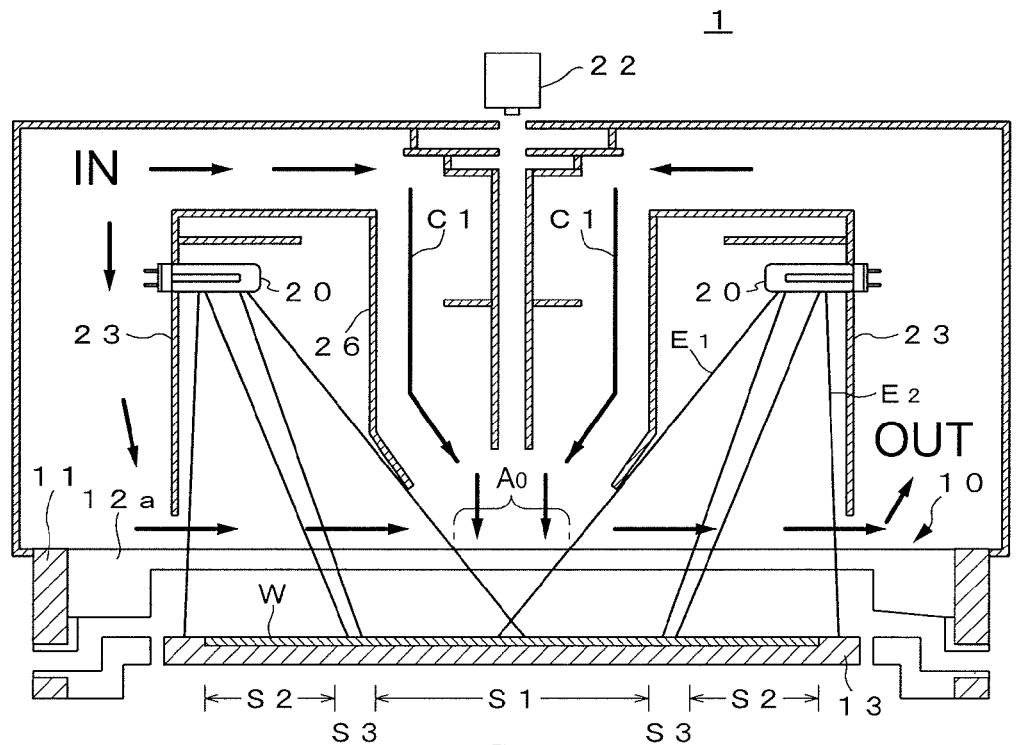
FIG. 5A is schematic diagrams illustrating the functionality of the additional reflection member in the case where the additional reflection member is not provided.
Figure 5B:
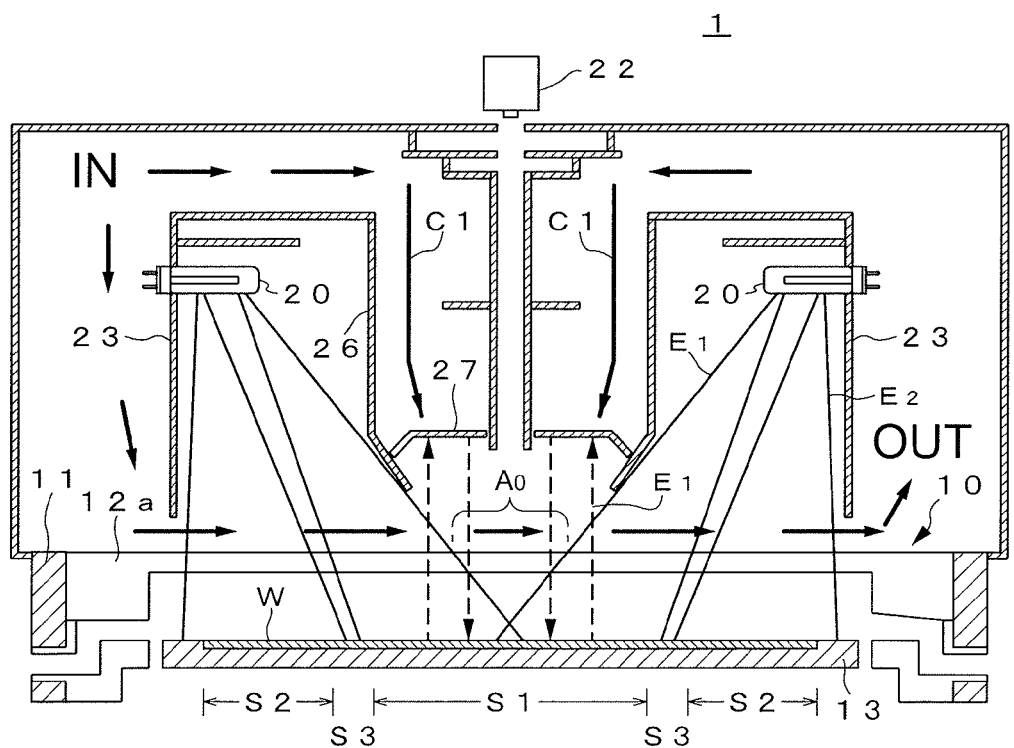
FIG. 5B is schematic diagrams illustrating the functionality of the additional reflection member in the case where the additional reflection member is provided.

FIGS. 4A, 4B, 5A and 5B are schematic diagrams illustrating the functionality of the additional reflection member 27. FIGS. 4A and 5A show the case where the additional reflection member 27 is not provided. FIGS. 4B and 5B show the case where the additional reflection member 27 is provided.

As shown in FIGS. 4A and 4B, the central region S1 of the wafer W is sufficiently heated by electromagnetic waves E1 coming from the above inner heating halogen lamps 20$i$ (See FIG. 2) of the upper lamp group 20G. The outer region S2 of the wafer W is sufficiently heated by electromagnetic waves E2 coming from the above outer heating halogen lamps 20$o$ (See FIG. 2). However, an intermediate region S3 between the central region S1 and outer region S2 of the wafer W is not sufficiently heated, and the in-plane temperature distribution of the wafer W therefore is uneven. If there is no additional reflection member 27 inside the reflection member 26 as shown in FIG. 4A, the electromagnetic waves E1 coming from the inner heating halogen lamps 20$i$ only travel upward after being reflected by the upper surface of the wafer W as indicated by broken line. Therefore, the intermediate region S3 of the wafer W is not heated by the reflected waves of the electromagnetic waves E1.

In the case where the additional reflection member 27 is provided inside the reflection member 26 as shown in FIG. 4B, the electromagnetic waves E1 coming from the inner heating halogen lamps 20$i$ travel upward after being reflected by the upper surface of the wafer W, and are then reflected again by the surface of the additional reflection member 27 to reach the intermediate region S3 of the wafer W. Therefore, the intermediate region S3 of the wafer W is sufficiently heated, and the in-plane temperature distribution of the wafer W therefore becomes even.

As shown in FIG. 5A, if no additional reflection member 27 is provided, a cooling air (air flow) C1 that travels from the upper side to the lower side via the inner part of the almost cylindrical reflection member 26 hits directly a central portion $A_0$ of the upper dome 12$a$ of the chamber 10. As a result, the temperature of the central portion $A_0$ of the upper dome 12$a$ becomes lower than the surrounding area. In particular, the electromagnetic waves E1 emitted from the upper lamp group 20G toward the central portion $A_0$ of the upper dome 12$a$ of the chamber 10 are blocked by the reflection member 26, and therefore cannot reach the central portion $A_0$ of the upper dome 12$a$. Accordingly, the temperature of the central portion $A_0$ of the upper dome 12$a$ is likely to drop. The drop in the temperature of the central portion $A_0$ of the upper dome 12$a$ is likely to cause the deposition of silicon by-products. The deposition of by-products hampers the thermal radiation energy from the halogen lamps 20 from passing through the upper dome 12$a$. As a result, the temperature of the central region S1 of the wafer W drops, resulting in further unevenness of the in-plane temperature distribution of the wafer W.

In the case where the additional reflection member 27 is provided inside the reflection member 26 as shown in FIG. 5B, the cooling air C1 traveling from the upper side to the lower side via the inner space of the reflection member 26 can be blocked. If the additional reflection member 27 is provided, the electromagnetic waves that are reflected by the upper surface of the wafer W are reflected again by the additional reflection member 27, and therefore travel to the central portion $A_0$ of the upper dome 12$a$. As a result, the electromagnetic waves are focused on the central portion $A_0$ of the upper dome 12$a$, and the central portion $A_0$ of the upper dome 12$a$ can be heated more than the surrounding area. In this manner, it is possible to curb a drop in the temperature of the central portion $A_0$ of the upper dome 12$a$ and prevent the deposition of by-products on the upper dome 12$a$.

In the above-described epitaxial growth apparatus 1, after the wafer W is placed on the susceptor 13, the upper lamp group 20G and the lower lamp group 21G are turned on to heat the wafer W. At the same time, a source gas, such as trichlorosilane ($SiHCl_3$) gas or dichlorosilane ($SiH_2Cl_2$) gas, is introduced via the gas inlet 16, while the air is discharged via the gas outlet 19.

The source gas passes through the baffle 17 and the rectifying member 18 from the gas inlet 16, and flows into the upper space of the chamber 10. The wafer W, the susceptor 13, and a preliminary ring 14 have been heated by the upper lamp group 20G and the lower lamp group 21G. The source gas flows along the heated surface of the wafer W as a laminar flow. As a result, epitaxial growth occurs on the wafer W, and an epitaxial layer is formed.

Figure 6:
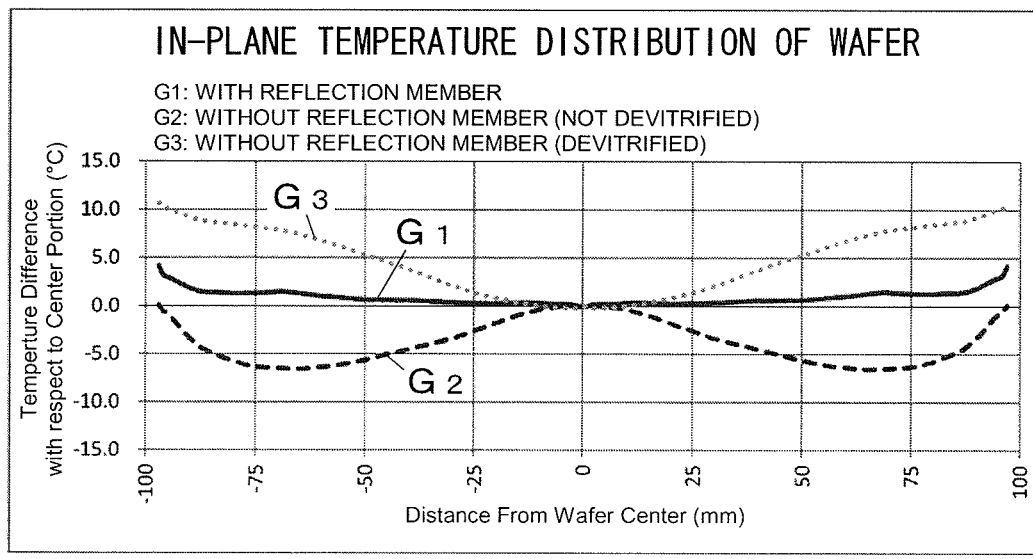
FIG. 6 is a graph showing the in-plane temperature distribution of the upper surface of the wafer.

FIG. 6 is a graph showing the in-plane temperature distribution of the upper surface of the wafer that is heated in the chamber. The horizontal axis represents the distance from the center of the wafer, and the vertical axis represents the temperature difference with respect to the center position of the wafer. A line G1 represents the temperature difference in the wafer that is heated by the epitaxial growth apparatus of the present embodiment which includes the additional reflection member 27. Lines G2 and G3 represent the temperature difference in wafers that are heated by a conventional epitaxial growth apparatus with no additional reflection member 27. More specifically, the line G2 shows the in-plane temperature distribution at a time when the upper dome is not devitrified, and the line G3 shows the in-plane temperature distribution at a time when the central portion of the upper dome is devitrified.

As shown in FIG. 6, if the conventional epitaxial growth apparatus is used, the additional reflection member 27 is not provided. Therefore, if the central portion of the upper dome is not devitrified, the temperature distribution is W-shaped as shown by the line G2. That is, the temperature of the central portion of the wafer W is relatively high, and the temperature of the outer peripheral portion of the wafer W is relatively high, too. However, the intermediate portion of the wafer is relatively low in temperature. If the central portion of the upper dome is devitrified due to the deposition of by-products, the temperature of the central portion of the wafer plunges as shown by the line G3, and the temperature distribution is therefore V-shaped. Such a temperature difference leads to a difference in growth of the epitaxial layer, and the epitaxial layer becomes even more uneven in thickness.

In the case where the epitaxial growth apparatus 1 of the present embodiment is used, the temperatures between the center and outer peripheral end of the wafer W become almost equal due to the effects of the additional reflection member (see line G1). Therefore, the in-plane temperature distribution of the wafer becomes uniform, curbing the in-plane unevenness in the thickness of the epitaxial layer. In this manner, high-quality epitaxial wafers can be produced.

Figure 7A:
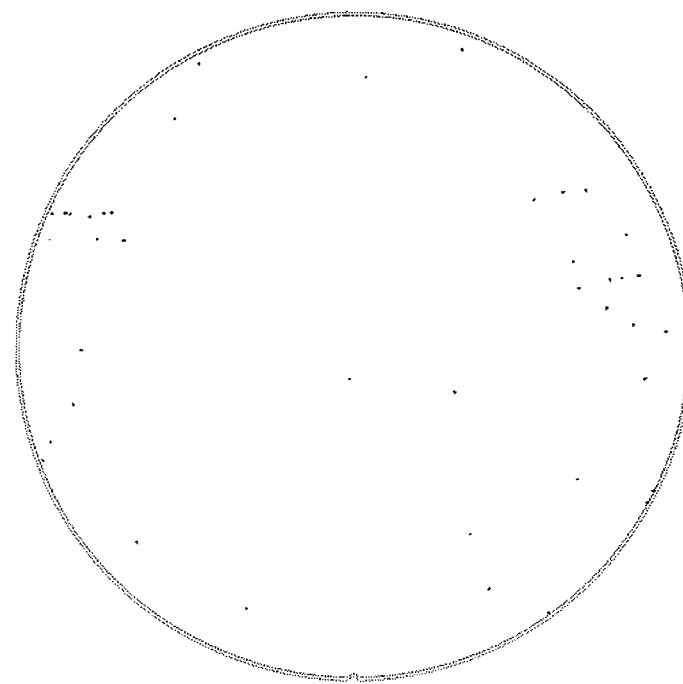
FIG. 7A is schematic plan views showing a dislocation generation distribution of the epitaxial wafer that is produced by the epitaxial growth apparatus of an embodiment of the present invention.
Figure 7B:
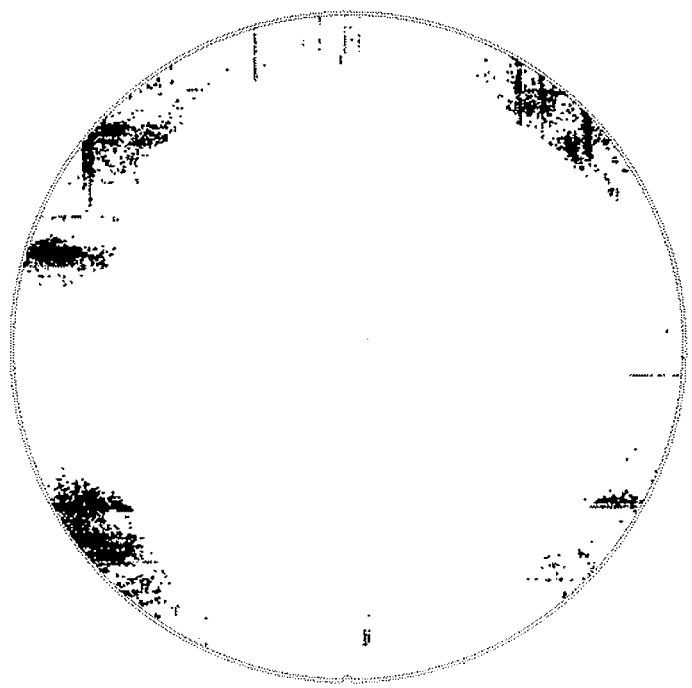
FIG. 7B is schematic plan views showing a dislocation generation distribution of the epitaxial wafer that is produced by a conventional epitaxial growth apparatus.

FIGS. 7A and 7B are schematic plan views showing a dislocation generation distribution of the epitaxial wafer. FIG. 7A shows a wafer that is produced by the epitaxial growth apparatus 1 of the present embodiment which includes the additional reflection member 27. FIG. 7B shows a wafer that is produced by a conventional epitaxial growth apparatus with no additional reflection member 27.

As shown in FIG. 7A, there are a very few slip dislocations on the epitaxial wafer produced by the epitaxial growth apparatus 1 of the present embodiment. As shown in FIG. 7B, there are many slip dislocations in the outer peripheral portion of the epitaxial wafer produced by a conventional epitaxial growth apparatus. In this manner, the epitaxial growth apparatus 1 of the present embodiment can prevent the occurrence of slip dislocations by reducing the unevenness in the in-plane temperature distribution of the wafer.

As described above, in the epitaxial growth apparatus 1 of the present embodiment, the additional reflection member is provided inside the almost cylindrical reflection member 26. Therefore, the in-plane temperature distribution of the wafer can be uniform. As a result, the uniformity of the film thickness distribution of the epitaxial layer can be ensured. Moreover, it is possible to prevent the deposition of silicon by-products on the upper dome 12a of the chamber 10 and to prevent the in-plane temperature distribution of the wafer from worsening.

It is apparent that the present invention is not limited to the above embodiments, but may be modified and changed without departing from the scope and spirit of the invention.

For example, in the above embodiment, halogen lamps are described as one example of heating lamps. However, the present invention is not limited to the halogen lamps. Any high-power heating sources that can generate infrared rays may be available. In the above embodiment, silicon wafers are described. However, the present invention is not limited to the silicon wafers, and may be used for various wafers.

In the above embodiment, the additional reflection member 27 is made up of the circular plate portion 27a and the sidewall portion 27b. Alternatively, the additional reflection member 27 may be dome-shaped, for example. The way the additional reflection member 27 is attached is not limited to the above-described method, and other methods may be employed.

What is claimed is:

1. An epitaxial growth apparatus for growing an epitaxial layer on a surface of a wafer, the apparatus comprising:
   a chamber in which the wafer is housed;
   an upper lamp group that includes a plurality of heating lamps arranged in a ring and that is provided above the chamber;
   a lower lamp group that includes a plurality of heating lamps and that is provided below the chamber;
   a reflection member that has a substantially cylindrical shape and that is provided inside the ring of the upper lamp group;
   an additional reflection member that includes a reflection surface substantially parallel to the surface of the wafer and that is provided inside the reflection member;
   a pyrometer that is provided above the chamber and the center of the wafer and that has an optical axis extending toward the wafer; and
   a shield tube that has a cylindrical shape and that is provided in such a way as to encircle the optical axis of the pyrometer,
   wherein the reflection member is provided in such a way as to surround the optical axis of the pyrometer and the shield tube,
   the additional reflection member is provided in such a way as to close at least part of an opening of a lower end portion of the reflection member, and
   the optical axis of the pyrometer and the shield tube pass through the additional reflection member wherein inside the reflection member is a region from which any heating lamps are excluded; and wherein a position of the additional reflection member is higher than a position of a lower end of the reflection member.

2. The epitaxial growth apparatus as claimed in claim 1, wherein the additional reflection member includes:
   a circular plate portion that constitutes the reflection surface; and
   a sidewall portion that is provided in such a way as to encircle an outer periphery of the circular plate portion.

3. The epitaxial growth apparatus as claimed in claim 2, wherein the additional reflection member includes a through-hole formed at a center of the circular plate portion, and
   the optical axis of the pyrometer passes through the through-hole.

4. The epitaxial growth apparatus as claimed in claim 3, wherein the shield tube is inserted into the through-hole of the additional reflection member.

5. The epitaxial growth apparatus as claimed in claim 1, wherein the reflection member has a tapered portion provided in a lower end portion thereof in such a way that a diameter thereof becomes gradually smaller toward a lower side, and an outer peripheral end of the additional reflection member is in contact with an inner peripheral surface of the tapered portion.

6. The epitaxial growth apparatus as claimed in claim 1, wherein the additional reflection member is made of the same material as the reflection member.

7. An epitaxial growth apparatus comprising:
   a chamber that can house a wafer;
   a heating source provided above the chamber;
   a first reflection member so provided as to be surrounded by the heating source; and
   a second reflection member so provided as to be surrounded by the first reflection member,
   a pyrometer that has an optical axis perpendicular to a main surface of the wafer; and
   a shield tube to surround the optical axis of the pyrometer,
   wherein the first reflection member includes a cylindrical surface that is substantially perpendicular to the main surface of the wafer,
   the second reflection member includes a flat surface that is substantially parallel to the main surface of the wafer and a through-hole through which the optical axis of the pyrometer passes, and
   the shield tube penetrates through the through-hole of the second reflection member wherein inside the first reflection member is a region from which any heating source are excluded; and wherein a position of the flat surface of the second reflection member is higher than a position of a lower end of the first reflection member.

8. The epitaxial growth apparatus as claimed in claim 7, wherein the first reflection member has a tapered portion that includes a tapered surface that is tapered to the main surface of the wafer.

9. The epitaxial growth apparatus as claimed in claim 8, wherein the second reflection member is in contact with the tapered portion of the first reflection member.

10. The epitaxial growth apparatus as claimed in claim 1, wherein the additional reflection member blocks a cooling air flow that travels from an upper side to a lower side via an internal space of the reflection member.

11. The epitaxial growth apparatus as claimed in claim 7, wherein the second reflection member blocks a cooling air flow that travels from an upper side to a lower side via an internal space of the first reflection member.

* * * * *